United States Patent
Lai et al.

(10) Patent No.: US 7,762,692 B2
(45) Date of Patent: Jul. 27, 2010

(54) SURFACE MOUNT LIGHT EMITTING DIODE ASSEMBLY AND BACKLIGHT MODULE USING THE SAME

(75) Inventors: Chih-Ming Lai, Miao-Li Hsien (TW); Hung-Kuang Hsu, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 310 days.

(21) Appl. No.: 12/013,920

(22) Filed: Jan. 14, 2008

(65) Prior Publication Data

US 2009/0046470 A1 Feb. 19, 2009

(30) Foreign Application Priority Data

Aug. 14, 2007 (CN) ......................... 2007 1 0201358

(51) Int. Cl.
*F21V 3/00* (2006.01)
*F21V 29/00* (2006.01)
(52) U.S. Cl. .............................. 362/311.02; 362/311.06; 362/612; 257/100
(58) Field of Classification Search ................. 362/600, 362/603, 608, 612, 614, 97.1, 311.02, 311.06, 362/311.07; 257/98, 100
See application file for complete search history.

(56) References Cited

U.S. PATENT DOCUMENTS

| | | | | |
|---|---|---|---|---|
| 5,786,665 A | * | 7/1998 | Ohtsuki et al. | 313/512 |
| 5,959,316 A | * | 9/1999 | Lowery | 257/98 |
| 6,036,328 A | * | 3/2000 | Ohtsuki et al. | 362/612 |
| 6,786,665 B2 | * | 9/2004 | Hwang et al. | 400/693 |
| 7,264,378 B2 | * | 9/2007 | Loh | 362/294 |
| 7,280,288 B2 | * | 10/2007 | Loh et al. | 359/726 |
| 7,602,559 B2 | * | 10/2009 | Jang et al. | 359/726 |
| 2003/0123247 A1 | * | 7/2003 | Parker et al. | 362/31 |
| 2004/0041222 A1 | * | 3/2004 | Loh | 257/433 |
| 2007/0292631 A1 | * | 12/2007 | Shinozaki et al. | 428/1.1 |

FOREIGN PATENT DOCUMENTS

| | | |
|---|---|---|
| CN | 1381904 A | 11/2002 |
| CN | 1404630 A | 3/2003 |
| CN | 1688029 A | 10/2005 |

OTHER PUBLICATIONS

Chien-Chih Chen et al., Sequential Color LED Backlight Driving System for LCD Panels, IEEE Transactions on power electronics, vol. 22, No. 3, May 2007.

* cited by examiner

*Primary Examiner*—Ali Alavi
(74) *Attorney, Agent, or Firm*—Jeffrey T. Knapp

(57) ABSTRACT

A surface mount LED assembly (10) comprises a substrate (11), a bonding pad, an LED chip (12) and a lens package (13). The bonding pad, the LED chip and the lens package are positioned on the substrate. The LED chip is electrically connected with the bonding pad. The lens package covers the LED chip. The lens package comprises a light emitting surface (132) located away from the LED chip. The light emitting surface is a curved surface protruding away from the substrate.

17 Claims, 5 Drawing Sheets

SURFACE MOUNT LIGHT EMITTING DIODE ASSEMBLY AND BACKLIGHT MODULE USING THE SAME

BACKGROUND OF THE INVENTION

1. Field of the Invention

The present invention relates to a surface mount light emitting diode assembly and a backlight module using the surface mount light emitting diode assembly, and more particularly to a surface mount light emitting diode assembly having a high light emitting efficiency.

2. Description of Related Art

Light emitting diode (LED) has many advantages, such as high luminance, low power consumption, good matching with integrated circuit, long-term reliability and environment friendliness. LED has been widely used as backlight source in liquid crystal display (LCD), as described in an article entitled "Sequential Color LED Backlight Driving System for LCD Panels" cited in a publication of IEEE Transactions on power electronics, Vol. 22, No. 3 May 2007, authored by Chien-Chih Chen.

A backlight source using LED normally includes a light guiding plate having a light incidence surface and a plurality of surface mount LEDs disposed adjacent to the light incidence surface. Each of the surface mount LEDs includes a substrate, an LED chip on the substrate and a lens package arranged on the substrate for covering the LED chip. The lens package has a light emitting surface away from the substrate. Normally, the light emitting surface is a plane surface. Light rays emitted by the LED chip transmit to ambient air through the light emitting surface. As a refractive index of the lens package is larger than that of the ambient air, the light rays pass from an optically denser medium to an optically thinner medium when transmitted from the lens package to the ambient air through the light emitting surface. Accordingly, a total reflection of the light rays tends to occur so that part of the light rays can not reach the outside of the lens package to cause light energy loss of the surface mount LED assembly.

Accordingly, what is needed is a surface mount LED assembly which can reduce light energy loss.

SUMMARY OF THE INVENTION

In accordance with an embodiment, a surface mount LED assembly comprises a substrate, a bonding pad, an LED chip and a lens package. The bonding pad, the LED chip and the lens package are positioned on the substrate. The LED chip is electrically connected with the bonding pad. The lens package covers the LED chip. The lens package comprises a light emitting surface located away from the LED chip. The light emitting surface is a curved surface protruding away from the substrate.

Other advantages and novel features of the present invention will become more apparent from the following detailed description of preferred embodiment when taken in conjunction with the accompanying drawings, in which:

DETAILED DESCRIPTION OF THE INVENTION

Figure 1:
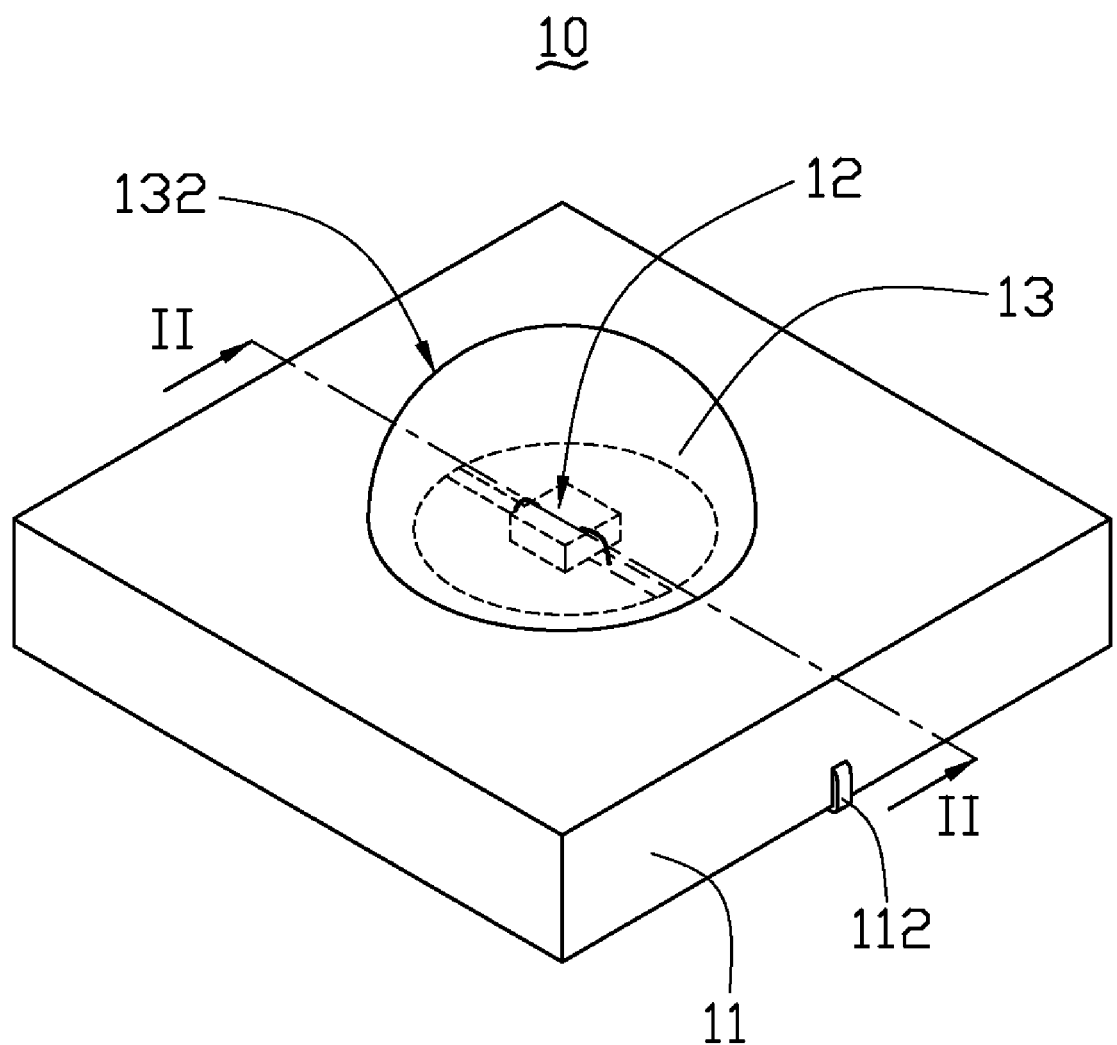
FIG. 1 is an isometric view of a surface mount LED assembly in accordance with a preferred embodiment of the present invention.
Figure 2:
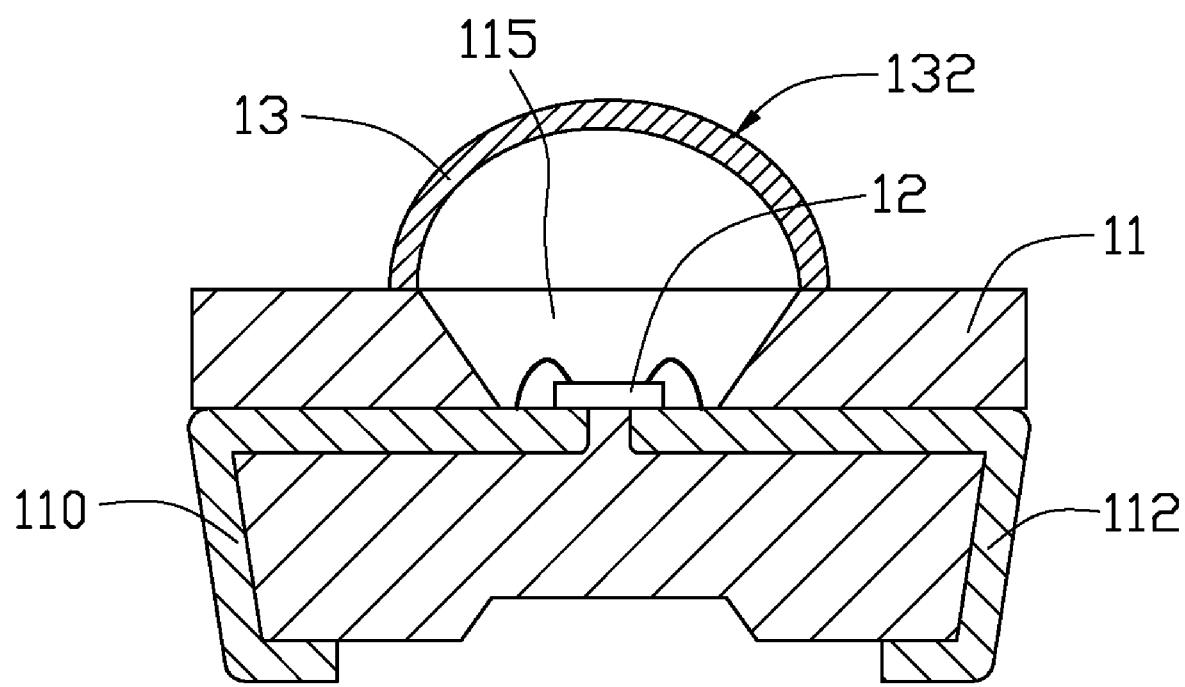
FIG. 2 is a cross-sectional view of the surface mount LED assembly shown in FIG. 1 along a line II-II.

Referring to FIG. 1 and FIG. 2, a surface mount LED assembly 10 in accordance with a preferred embodiment of the present invention is shown. The surface mount LED assembly 10 comprises a substrate 11, an LED chip 12 mounted on the substrate 11 and a lens package 13 covering the LED chip 12.

The substrate 11 is used for holding the LED chip 12 and can be comprised of III-IV group compounds semiconductor material, such as GaN. The substrate 11 has an inverted, cone-shaped recess 115 defined in a top surface thereof. The substrate 11 comprises a first electrode 110 and a second electrode 112 for providing power supply for the LED chip 12. The electrodes 110, 112 are electrically connected with the LED chip 12 so as to form two bonding pads for the surface mount LED assembly 10.

The LED chip 12 is received in the cone-shaped recess 115 of the substrate 11 and can be a GaN LED chip, InGaN LED chip or AlInGap LED chip, etc.

The lens package 13 is positioned to cover the LED chip 12. The lens package 13 is preferably made of a transparent material selected from the group consisting of resin, glass and silicone. In the present embodiment, the lens package 13 is made of a resin, such as epoxy resin or polymethyl methacrylate (PMMA). The lens package 13 has a hemispherical outer surface and has a stuffing material (not shown) fully receiving in a room covered by the lens package 13 and the recess 115. The stuffing material may be resin as mentioned above. The hemispherical outer surface of the lens package 13 is a light emitting surface 132 and located away from the LED chip 12. Light rays emitted by the LED chip 12 passes through an inside of the lens package 13 and reaches an outside of the lens package 13 through the light emitting surface 132. A sphere centre of the light emitting surface 132 is superposed with a center of the LED chip 12 thereby any part of the light emitting surface 132 having a substantially identical distance from the LED chip 12, so that most of the light rays emitted from the LED chip 12 can radiate on respective parts of the light emitting surface 132 at an approximately zero incident angle. Accordingly, a total reflection caused by the lens package 13 can be reduced greatly, and a light emitting efficiency of the surface mount LED assembly 10 can be greatly improved. That is, most of the light rays emitted from the LED chip 12 can be extracted and transmitted to an outside of the lens package 13.

It is easily understood that the light emitting surface 132 is not limited to a hemispherical surface. Fox example, the light emitting surface 132 can also be one third of a spherical surface, one fourth of a spherical surface or a paraboloidal surface so long as the incidence angel of the light rays at the light emitting surface 132 can be reduced to a low numerical value in order to reduce the total reflection in the light emitting surface 132. Accordingly, the light emitting efficiency of the surface mount LED assembly 10 can be greatly improved. Therefore, the surface mount LED assembly 10 is provided with a light emitting surface 132 which protrudes away from the substrate 11 and has a curved surface. The incidence angel of the light rays casting on the light emitting surface 132 is limited to a low numerical value by the curved surface so that the total reflection can be greatly reduced and the light emitting efficiency of the surface mount LED assembly 10 can be improved.

Figure 3:
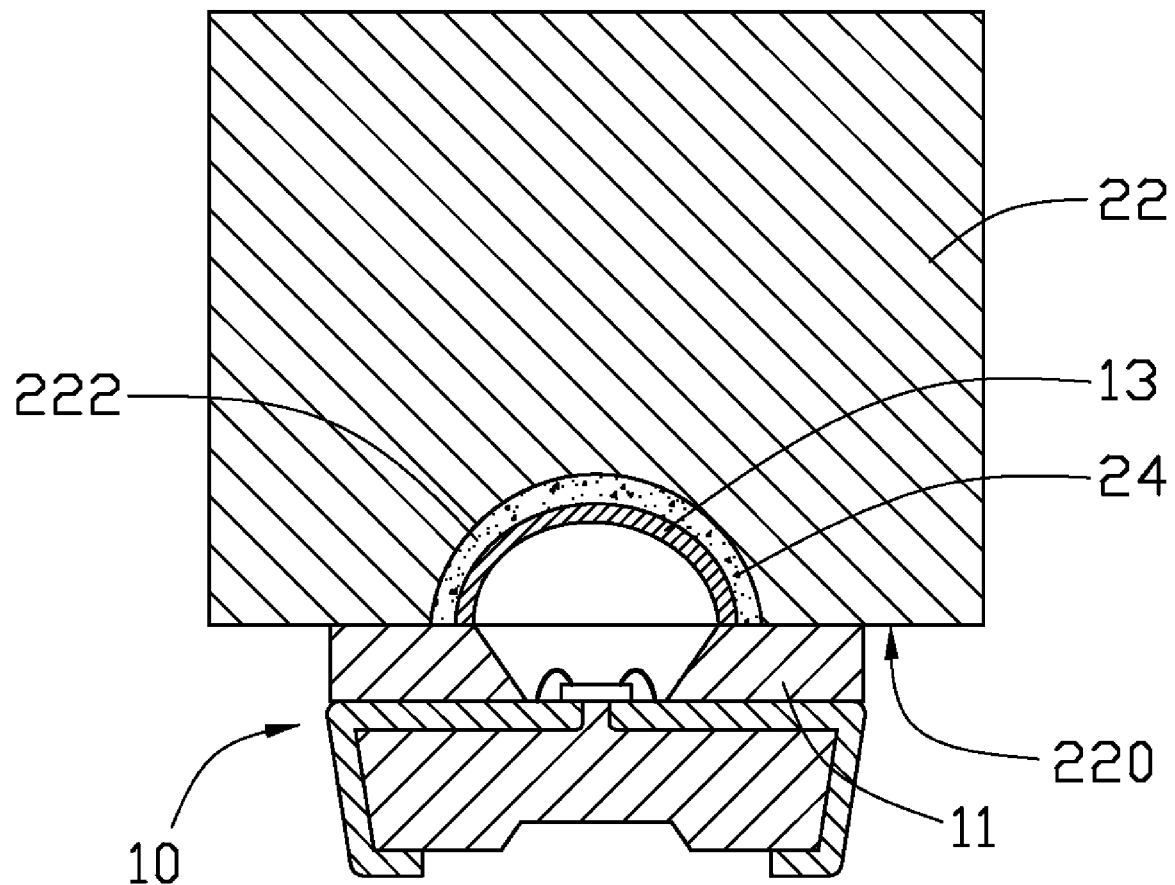
FIG. 3 is a cross-sectional view of a backlight module using the surface mount LED assembly of FIG. 1.

Referring to FIG. 3, a backlight module 20 using the surface mount LED assembly 10 is shown. The backlight module 20 comprises the surface mount LED assembly 10 and a light guiding plate 22. The light guiding plate 22 can be made by a transparent material selected from the group consisting of plastic material, resin, glass and silicone. The light guiding plate 22 has a first surface 220. A receiving groove 222 having a hemispherical inner surface is defined in the first surface 220 of the light guiding plate 22. The surface mount LED assembly 10 is positioned abutting to the first surface 220 as the lens package 13 is received in the hole of the receiving portion 222.

The inner surface of the receiving groove 222 of the light guiding plate 22 is a curved surface and is used for receiving the light rays out of the lens package 13 of the LED chip 10. A radius of curvature of the inner surface of the receiving groove 222 is larger than that of the light emitting surface 132 of the lens package 13. A padding 24 is sandwiched between the light emitting surface 132 of the lens package 13 and the inner surface of the receiving groove 222 of the light guiding plate 22 for filling a gap therebetween and securing the surface mount LED assembly 10 to the light guiding plate 22. The padding 24 can be solidified by heating under a pressure applied on the surface mount LED assembly 10 towards the light guiding plate 22.

For reducing a difference between the refractive indexes of the padding 24, the lens package 13 and the light guiding plate 22, and accordingly eliminating an optical interference, the refractive index of the padding 24 is preferably limited to a range between the refractive index of the lens package 13 and the refractive index of the light guiding plate 22. For example, if the refractive index of each of the lens package 13 and the light guiding plate 22 is in a range from 1.4 to 1.5, the refractive index of the padding 24 is preferably in a range of 1.4~1.5. In the present embodiment, the refractive indexes of the padding 24, the lens package 13 and the light guiding plate 12 are same.

The padding 24 in the present embodiment is made of silicone which is a soft, transparent material. The soft padding 24 can make an intimate contact between the lens package 13 and the light guiding plate 22. It is also easy to clean up the silicone of the padding 24 so that maintenance and repair work on the backlight module 20 become simple. The padding 24 can also use a liquid material having a high cohesive coefficient which is more easy for maintenance and repair than silicone. The padding 24 can also be made by a material selected from the group consisting of colloid, gelatin, epoxy and glass. The padding 24 can further comprise a fluorescent powder mixed therein or a fluorescent powder layer covered on a surface thereof.

Figure 4:
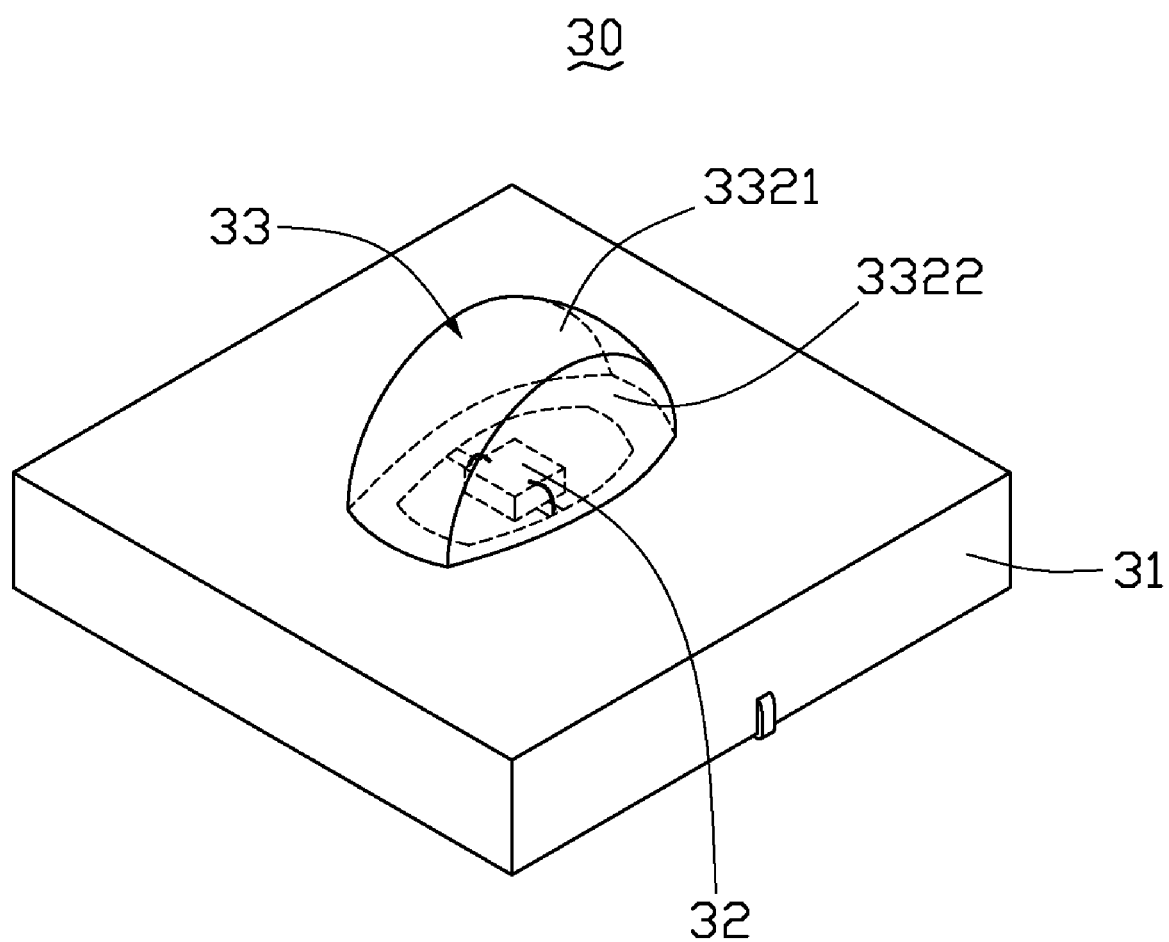
FIG. 4 is an isometric view of a surface mount LED assembly in accordance with a second embodiment of the present invention.
Figure 5:
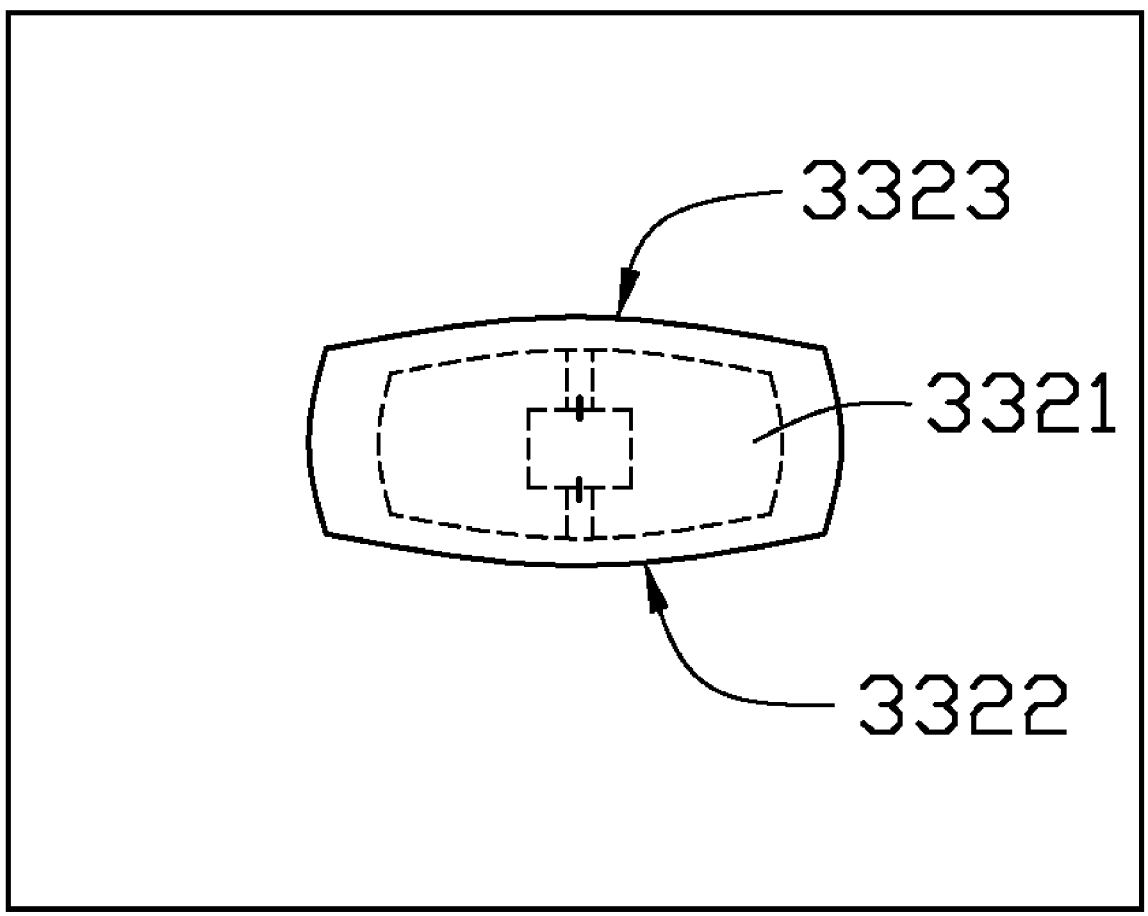
FIG. 5 is a top plan view of the surface mount LED assembly shown in FIG. 4.

It is understood that the lens package 13 is not limited to have a hemispherical shape. Referring to FIG. 4 and FIG. 5, a surface mount LED assembly 30 in accordance with a second embodiment of the present invention is shown. The surface mount LED assembly 30 has a similar configuration with the surface mount LED assembly 10 and comprises a substrate 31, an LED chip 32 secured on the substrate 31 and a lens package 33. The difference between the surface mount LED assembly 10 and the surface mount LED assembly 30 is that the surface mount LED assembly 30 has a first light emitting surface 3321, a second light emitting surface 3322 and a third light emitting surface 3323. The first light emitting surface 3321 is positioned in a middle of the lens package 33 and the second light emitting surface 3322 and the third light emitting surface 3323 are respectively positioned at two opposite lateral sides of the first light emitting surface 3321. The light emitting surface 3322, 3323 are approximately, symmetrically with respect to the first light emitting surface 3321. The first light emitting surface 3321 is curved upwardly, and each of the second and third light emitting surfaces 3322, 3323 is curved outwardly. The light emitting surface 3322, 3323 are respectively, perpendicular to the first light emitting surface 3321. The second light emitting surface 3322 has a same radius of curvature as that of the third light emitting surface 3323. The first light emitting surface 3321 has a larger radius of curvature than that of each of the light emitting surfaces 3322, 3323.

Because the first light emitting surface 3321 has a larger radius of curvature than that of each of the light emitting surfaces 3322, 3323, light rays transmitted to the first light emitting surface 3321 have a smaller incidence angle than light rays transmitted to the light emitting surfaces 3322, 3323. Thus, a total reflection occurring in the first light emitting surface 3321 is less than that occurring in the light emitting surfaces 3322, 3323. A light emitting efficiency of the first light emitting surface 3321 is higher than that of the light emitting surfaces 3322, 3323. The light rays casting on the light emitting surfaces 3322, 3323 can be reflected to the first light emitting surface 3321 so that a light emitting intensity of the first light emitting surface 3321 of the lens package 33 is strengthened. Therefore, light emitting intensity of different light emitting surfaces of the lens package 33 can be adjusted by changing radiuses of curvature of the light emitting surfaces according to need in applications. In other embodiments of the present invention, the third light emitting surface 3323 and the second light emitting surface 3322 can be selected to be two curved surfaces having different radiuses of curvature, or one plane surface and one curved surface, or both plane surfaces.

What is claimed is:

1. A surface mount LED assembly comprising:
a substrate;
a bonding pad formed on the substrate;
an LED chip electrically connected with the bonding pad; and
a lens covering the LED chip;
wherein the lens comprises a first light emitting surface facing away from the LED chip, and the first light emitting surface is a curved surface protruding in a direction away from the substrate;
wherein the lens comprises a second light emitting surface and a third light emitting surface located at two opposite sides of the first light emitting surface, and the second emitting surface and the third light emitting surface are selected to be two curved surfaces each having a different radius of curvature from the first light emitting surface, or one plane surface and one curved surface having a different radius of curvature from the first light emitting surface, or both plane surfaces.

2. The surface mount LED assembly as described in claim 1, wherein the curved surface of the first light emitting surface of the lens has a spherically-shaped profile or a paraboloidally-shaped profile.

3. The surface mount LED assembly as described in claim 2, wherein the curved surface of the first light emitting surface of the lens is a hemispherical surface.

4. The surface mount LED assembly as described in claim 1, wherein the lens is comprised of a transparent material selected from the group consisting of resin, glass and silicone.

5. A backlight module comprising:
a surface mount LED assembly; and a light guiding plate;
wherein the light guiding plate comprises a first surface, the surface mount LED assembly comprises a substrate, a bonding pad formed on the substrate, an LED chip electrically connected with the bonding pad and a lens covering the LED chip, the lens comprises a first light emitting surface facing away from the LED chip, the first light emitting surface is a curved surface protruding in a direction away from the substrate, the light guiding plate comprises a recess defined in the first surface, and the lens is received in the recess;
wherein the lens further comprises a second light emitting surface and a third light emitting surface located at two opposite sides of the first light emitting surface, and the second emitting surface and the third light emitting surface are selected to be two curved surfaces each having a different radius of curvature from the first light emitting surface, or one plane surface and one curved surface having a different radius of curvature from the first light emitting surface, or both plane surfaces.

6. The backlight module as described in claim 5, wherein the lens is comprised of a transparent material selected from the group consisting of resin, glass and silicone.

7. The backlight module as described in claim 5, wherein the curved surface of the first light emitting surface of the lens has a spherically-shaped profile or a paraboloidally-shaped profile.

8. The backlight module as described in claim 7, wherein the curved surface of the first light emitting surface of the lens is a hemispherical surface.

9. The backlight module as described in claim 5, wherein an inner surface in the recess of the light guiding plate is a curved surface, a radius of curvature of the inner surface of the recess is larger than or equal to that of the first light emitting surface of the lens.

10. The backlight module as described in claim 9, wherein a light permeable material is arranged between the first light emitting surface of the lens and the inner surface in the recess of the light guiding plate.

11. The backlight module as described in claim 10, wherein a refractive index of the light permeable material is equal to that of the lens and the light guiding plate.

12. The backlight module as described in claim 10, wherein the light permeable material comprises a fluorescent powder mixed therein or a fluorescent powder layer formed on a surface thereof.

13. The backlight module as described in claim 10, wherein the light permeable material is selected from the group consisting of colloid, gelatin, epoxy, glass and silicone.

14. The backlight module as described in claim 10, wherein a refractive index of the light permeable material is in a range between a refractive index of the lens and a refractive index of the light guiding plate.

15. The backlight module as described in claim 14, wherein the refractive index of the light permeable material is in a range of 1.4~1.5.

16. A backlight module comprising:
a light guiding plate having a light incident surface with a recess defined in the light incident surface, the light guiding plate having an inner concave surface in the recess;
a substrate;
an LED chip electrically mounted on the substrate;
a lens attached on the substrate, the lens and the substrate cooperatively enveloping the LED chip therein, the lens being received in the recess of the light guiding plate, the LED chip being located outside the recess of the light guiding plate, the lens comprising a convex surface facing toward the inner concave surface of the light guiding plate, a radius of curvature of the inner concave surface of the light guiding plate being greater than that of the convex surface of the lens; and
a light permeable material filled between the inner concave surface of the light guiding plate and the convex surface of the lens;
wherein the convex surface of the lens is taken as a first light emitting surface of the lens, the lens further comprises a second light emitting surface and a third light emitting surface located at two opposite sides of the first light emitting surface, and the second emitting surface and the third light emitting surface are selected to be two curved surfaces each having a different radius of curvature from the first light emitting surface, or one plane surface and one curved surface having a different radius of curvature from the first light emitting surface, or both plane surfaces.

17. The backlight module as described in claim 16, wherein a refractive index of the light permeable material is in the range from the minimum of that of the light guiding plate and the lens to the maximum of that of the light guiding plate and the lens.

* * * * *